(12) United States Patent
Ikeda et al.

(10) Patent No.: US 7,483,317 B2
(45) Date of Patent: Jan. 27, 2009

(54) LAMINATED MEMORY HAVING AUTONOMICALLY AND SEQUENTIALLY ACTIVATING OPERATION

(75) Inventors: Hiroaki Ikeda, Tokyo (JP); Junji Yamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/690,032

(22) Filed: Mar. 22, 2007

(65) Prior Publication Data

US 2007/0228456 A1    Oct. 4, 2007

(30) Foreign Application Priority Data

Mar. 29, 2006    (JP)    ............................. 2006-090062

(51) Int. Cl.
*G11C 11/00*    (2006.01)
(52) U.S. Cl. .................................. 365/194; 365/230.06
(58) Field of Classification Search ................. 365/194, 365/230.06
See application file for complete search history.

(56) References Cited

U.S. PATENT DOCUMENTS

| | | | |
|---|---|---|---|
| 6,693,825 B1 * | 2/2004 | Sharma et al. | ............... 365/158 |
| 2006/0056244 A1 * | 3/2006 | Ware | .......................... 365/194 |

FOREIGN PATENT DOCUMENTS

| | | |
|---|---|---|
| JP | 64-4997 A | 1/1989 |
| WO | 03/073430 A1 | 9/2003 |

* cited by examiner

*Primary Examiner*—Michael T Tran
(74) *Attorney, Agent, or Firm*—Sughrue Mion, PLLC

(57) ABSTRACT

In a laminated memory, each of memory core layers includes a delay circuit having a period of delay time corresponding to a period of operation time of an internal memory circuit portion thereof. A memory core layer, which is input with a simultaneous operation signal, operates in response to the input operation signal. The delay circuit includes an autonomically and sequentially activating function for sending an operation signal to a next stage after the period of delay time passes.

14 Claims, 5 Drawing Sheets

LAMINATED MEMORY HAVING AUTONOMICALLY AND SEQUENTIALLY ACTIVATING OPERATION

This application claims priority to prior Japanese patent application JP2006-90062, the disclosure of which is incorporated herein by reference.

BACKGROUND OF THE INVENTION

The present invention relates to a laminated memory in which a plurality of memories are laminated, and more particularly to a simultaneous operation control of the layers of laminated memory cores (hereinafter, referred to as memory core layers).

Recently, electronic equipment is reduced in size and semiconductor devices used in it are also reduced in size.

For example, a three-dimensionally laminated semiconductor device is used for small electronic equipment such as a mobile phone and the like. In the three-dimensionally laminated semiconductor device, a plurality of semiconductor chips are laminated and accommodated in one package in a state that they are connected to each other. A semiconductor device can be reduced in size by arranging it as a three-dimensionally laminated semiconductor device in which semiconductor chips are laminated as described above. MCP (Multi Chip Package), in which semiconductor chips are laminated, and PoP (Package on Package), in which small-sized packages are laminated in place of chips, have been developed as the three-dimensionally laminated semiconductor device so that the size of a semiconductor device is reduced and the operating speed thereof is increased.

The laminated semiconductor device includes a laminated memory in which memory chips are laminated, and the laminated memory includes a laminated DRAM in which, for example, a dynamic random access memory (hereinafter, referred to as DRAM) chips are laminated. The laminated DRAM can be arranged as a memory module or a semiconductor memory device having a large capacity by laminating a plurality of semiconductor chips. In a refresh operation and a parallel test of the laminated DRAM, all the layers of the laminated semiconductor chips are operated simultaneously. The simultaneous operation of all the memory core layers is an operation control mode suitable for simultaneous processing of a large amount of data in the refresh operation and the parallel test.

However, the laminated structure has an environmental condition specific to it in, for example, that power supply systems of the respective layers are dependently connected and that a temperature is different depending on the positions of the memory core layers. When all the memory core layers are operated simultaneously, a problem arises in that a power supply is varied by that transient currents are overlapped and that input/output characteristics are made unstable by the overlapped transient currents. To cope with the above problem, it is contemplated to use a method of sequentially operating memory blocks (banks) to be operated in parallel. However, some problems arise when a conventional sequential operation control method is used as it is.

WO2003/073430 (patent document 1) and Japanese Unexamined Patent Application Publication No. 1-004997 (patent document 2) are patent documents that relate to the conventional sequential operation control method. In the patent documents 1 and 2, the period of operation times of respective memory blocks are delayed so that an operation current is dispersed. In the patent document 1, when a flash memory is initialized, a control signal of each bank is delayed for a predetermined period of time. An operation current is dispersed by setting a different time as a time at which each bank is operated to thereby suppress a peak current. In the patent document 2, a control signal to each block is delayed for a predetermined period of time in a refresh operation of DRAM. The operation current is dispersed by setting a different period of operation time to each block to thereby suppress a peak current.

The simultaneous operation of all the layers of the laminated memory will be explained referring to FIGS. 1A-1C. FIG. 1A shows a side elevational view of the laminated memory, FIG. 1B shows a current waveform in the simultaneous operation, and FIG. 1C shows a current waveform in a sequential operation.

The laminated memory includes eight memory core layers 1 (1-#1 to 1-#8) laminated on a control logic layer 2. FIG. 1B shows the current waveform when all the eight memory core layers 1 are operated simultaneously. The current values of the respective layers are overlapped by simultaneously operating them. This results in a peak current value which is several times to eight times at maximum larger than the operation current. In this case, a power supply is varied because a transient current is overlapped and output characteristics are made unstable due to the variation of the power supply. Accordingly, when the conventional sequential operation control method is applied to the laminated memory, the current waveform is made as shown in FIG. 1C. Thus, the peak current value can be reduced.

As described above, in the conventional sequential operation, the control signal is delayed for a predetermined period of time (T) so that a sequential delay operation is carried out at a different period of operation time. As shown in FIG. 1C, when eight memory core layers are used, a current is dispersed to a total period of 7T+a by being delayed for the predetermined period of time (T). However, the sequential delay operation of the memory core layers is carried out in synchronism with an external clock at time intervals less correlating with an internal period of operation time. Accordingly, a problem arises in that a delay effect and a current dispersion effect are poor in a high speed clock and an overall period of operation time is remarkably increased in a low speed clock.

Further, when the sequential operation is started by a period of delay time in an external control circuit, the period of delay time in the external control circuit is different from the delay periods of time of operation of the respective layers. Accordingly, when the period of delay time in the external control circuit is short, the currents of the respective layers are overlapped. As a consequence, the current dispersion effect becomes poor. Thus, when the sequential delay operation is carried out by the external clock and the period of delay time in the external control circuit, it is difficult to set a proper period of delay time. In particular, in the laminated memory, the memory cores to be laminated have a different operation speed due to variation in manufacture. Further, the plurality of memory cores are dependently connected. Consequently, the power supply voltage supplied to the external control circuit and the peripheral temperature thereof are different from the power supply voltage supplied to the layered memory cores and the peripheral temperature thereof. Accordingly, since the period of delay time in the external control circuit is different from the delay periods of time of operation of the respective layers, a proper period of delay time is more difficult to be set.

SUMMARY OF THE INVENTION

As described above, a simultaneously operation of all the memory core layers in the laminated memory is disadvantageous in that the power supply is varied by that the transient currents are overlapped and the output characteristics are made unstable due to the variation of the power supply. Further, a proper period of delay time is difficult to be set in the sequential delay operation carried out in synchronism with the external clock and the external control circuit.

It is therefore an object of the present invention to provide a laminated memory which can carry out a series of simultaneously operations at a more proper timing by activating respective memory core layers at a more proper period of delay time by providing each of the memory core layers with a delay circuit and an autonomically and sequentially activating function for activating a next memory core layer after a proper period of delay time passes.

To overcome the above problems, the present invention basically employs the technologies described below. Further, it is needless to say that applied technologies which can be variously modified within a scope that does not depart from the gist of the above technologies are also included in the present invention.

A laminated memory of the present invention includes a plurality of memory core layers laminated therein, each of the memory core layers includes an internal memory circuit portion and a delay circuit having a period of delay time corresponding to a period of operation time of the internal memory circuit portion, a memory core layer activated by a simultaneous operation signal operates the internal memory circuit portion disposed therein as well as a memory core layer of a next stage is activated by an output signal delayed by the delay circuit.

In the laminated memory of the present invention, each of the memory core layers further includes a core control circuit, an internal signal from a core control circuit of a first memory core layer, to which the simultaneous operation signal is input, activates an internal memory circuit portion of the first memory core layer as well as is input to a delay circuit of the first the memory core layer.

In the laminated memory of the present invention, each of the memory core layers further includes a logic circuit, a logic circuit of the first memory core layer is input with the all-layers simultaneous operation signal and an output signal from the delay circuit of the first memory core layer and outputs an operation signal for activating the second memory core layer of a next stage.

In the laminated memory of the present invention, wherein a core control circuit of the second memory core layer is input with the operation signal from the first memory core layer and operates an internal memory circuit portion of the second memory core layer as well as a delay circuit of the second memory core layer, which is input with an internal signal as an output of thereof, outputs an output signal at a time corresponding to an operation time of the second internal memory circuit portion and a logic circuit of the second memory core layer is input with an operation signal from the first memory core layer and an output signal from the delay circuit of the second memory core layer and outputs an operation signal for activating the third memory core layer of a next stage.

In the laminated memory of the present invention, the first memory core layer is a memory core layer located near to a control logic layer, the second memory core layer is a memory core layer located near to the first the memory core layer, and the remaining memory core layers located near to each other are sequentially activated.

In the laminated memory of the present invention, the first memory core layer is selectively activated by a command/address signal and a memory core layer identification number, and the output signal from the delay circuit of the first the memory core layer activates the second memory core layer of a next stage.

In the laminated memory of the present invention, each of the memory core layers further comprises a logic circuit, the logic circuit of the second memory core layer is input with the all-layers simultaneous operation signal and an output signal from the first the memory core layer, a core layer control circuit of the second memory core layer is input with an output from the logic circuit of the second memory core layer, and an internal signal as an output thereof activates the internal memory circuit of the second memory core layer as well as input to the delay circuit of the second memory core layer, and the third memory core layer is activated by an output from the delay circuit.

In the laminated memory of the present invention, each of the memory core layers comprises spiral connection terminals, and the terminals are sequentially connected clockwise such that an output from a delay circuit of the memory core layer of a previous stage is connected to one input terminal of a logic circuit of the memory core layer of a next stage.

In the laminated memory of the present invention, an identification number is stored to each of the memory core layers as the memory core layer identification number.

In the present invention, each of the memory core layers includes the delay circuit, and the output signal obtained by delaying the all-layers simultaneous operation signal from the control layer by the delay circuit of each memory core layer is sent to a next stage. The dependently connected memory core layers have the autonomically and sequentially activating function for activating a next memory core layer after a proper period of delay time in each memory core layer.

Each of the memory core layers has a different period of operation time due to variation of an operation speed caused by variation in manufacture, power supply noise that changes depending on a position of the layers, and a change of an operation temperature. The delay circuit of each memory core layer is arranged such that it has the same characteristics as those of the period of operation time to thereby equalize the period of operation time of each memory core layer with the period of delay time of the delay circuit. Accordingly, the respective memory core layers can be operated at a more proper operation timing. Thus, an effect of suppressing the peak value of a transient current to ⅓ to ⅛ and reducing switching of a power supply line and a GND line can be obtained.

DESCRIPTION OF THE PREFERRED EMBODIMENTS

Figure 1A:
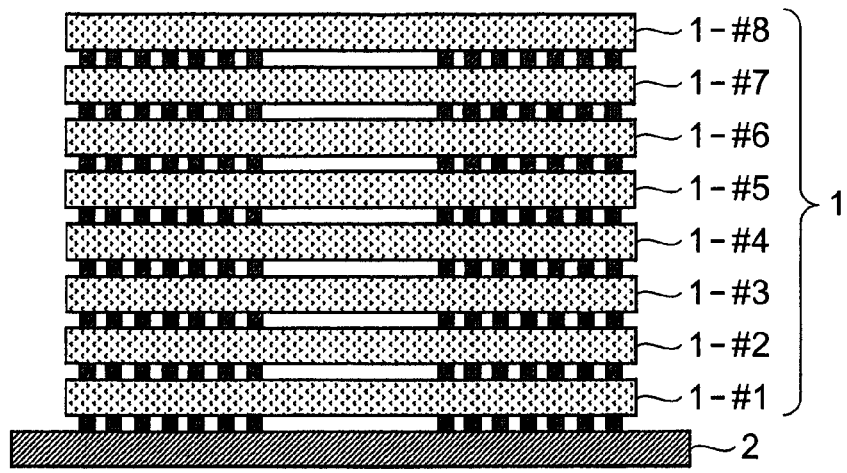
FIG. 1A is a side elevational view of a laminated memory in a conventional example.
Figure 1B:
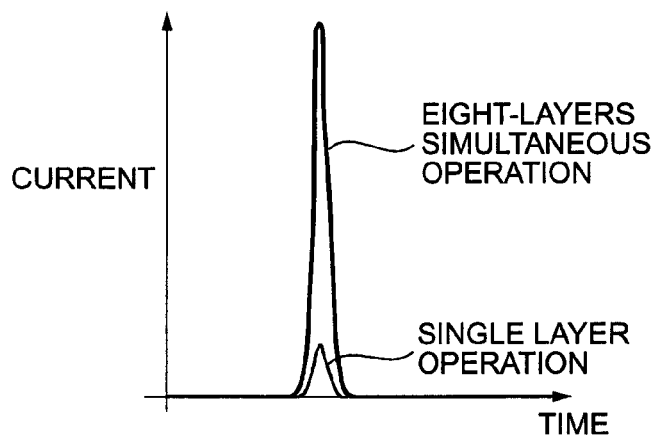
FIG. 1B is a current waveform view of the conventional example in a simultaneous operation.
Figure 1C:
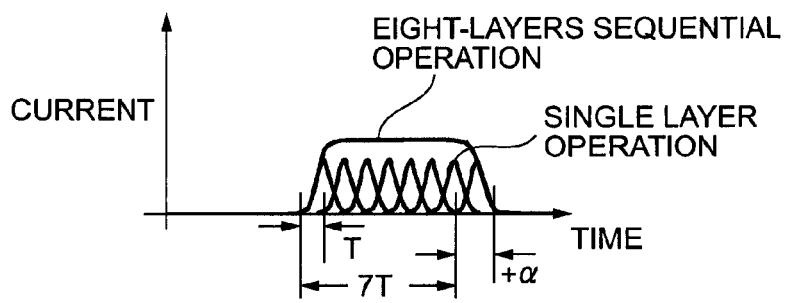
FIG. 1C is a current waveform view of the conventional example when eight layers are sequentially operated.
Figure 3:
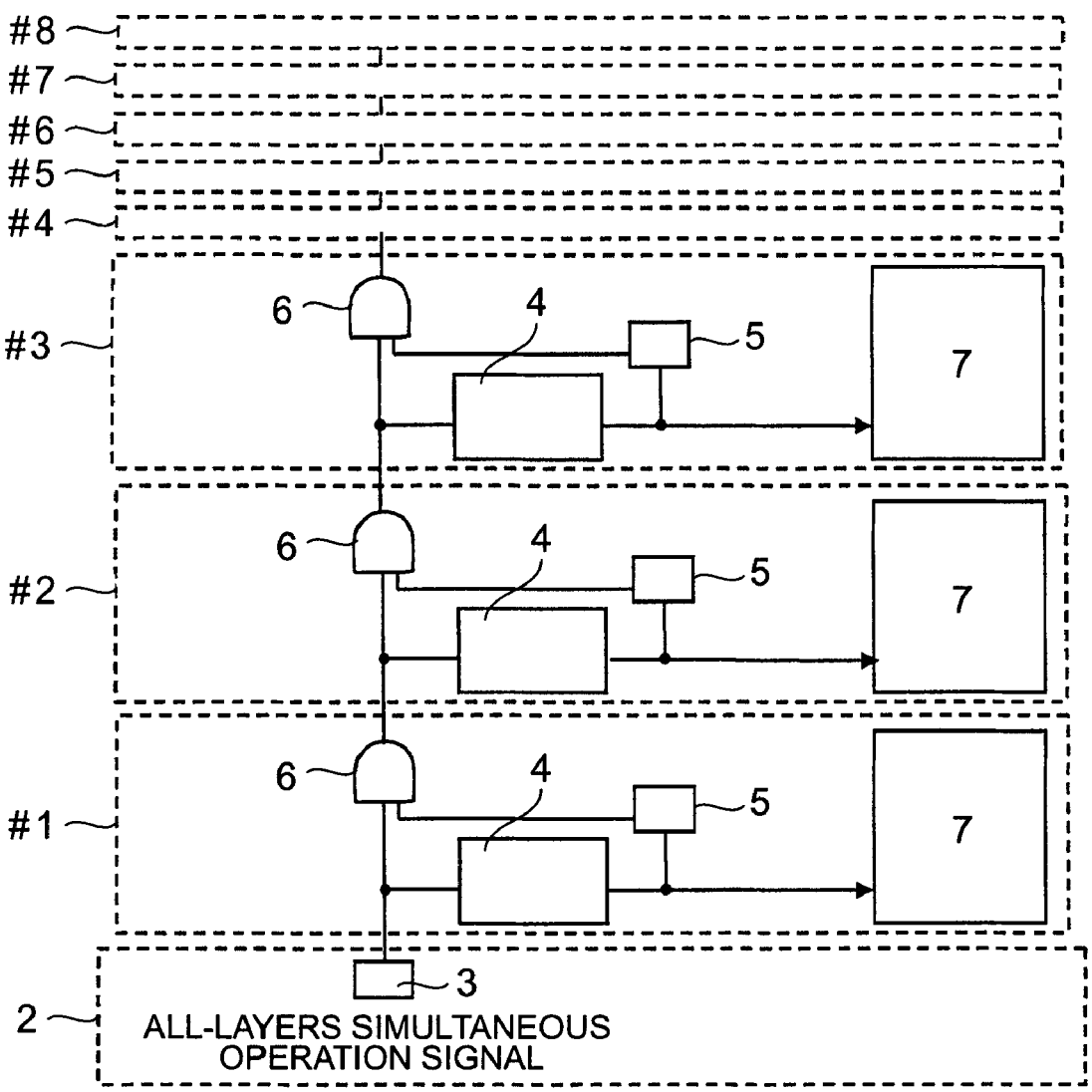
FIG. 3 is a block diagram of the laminated memory in the present invention.
Figure 4:
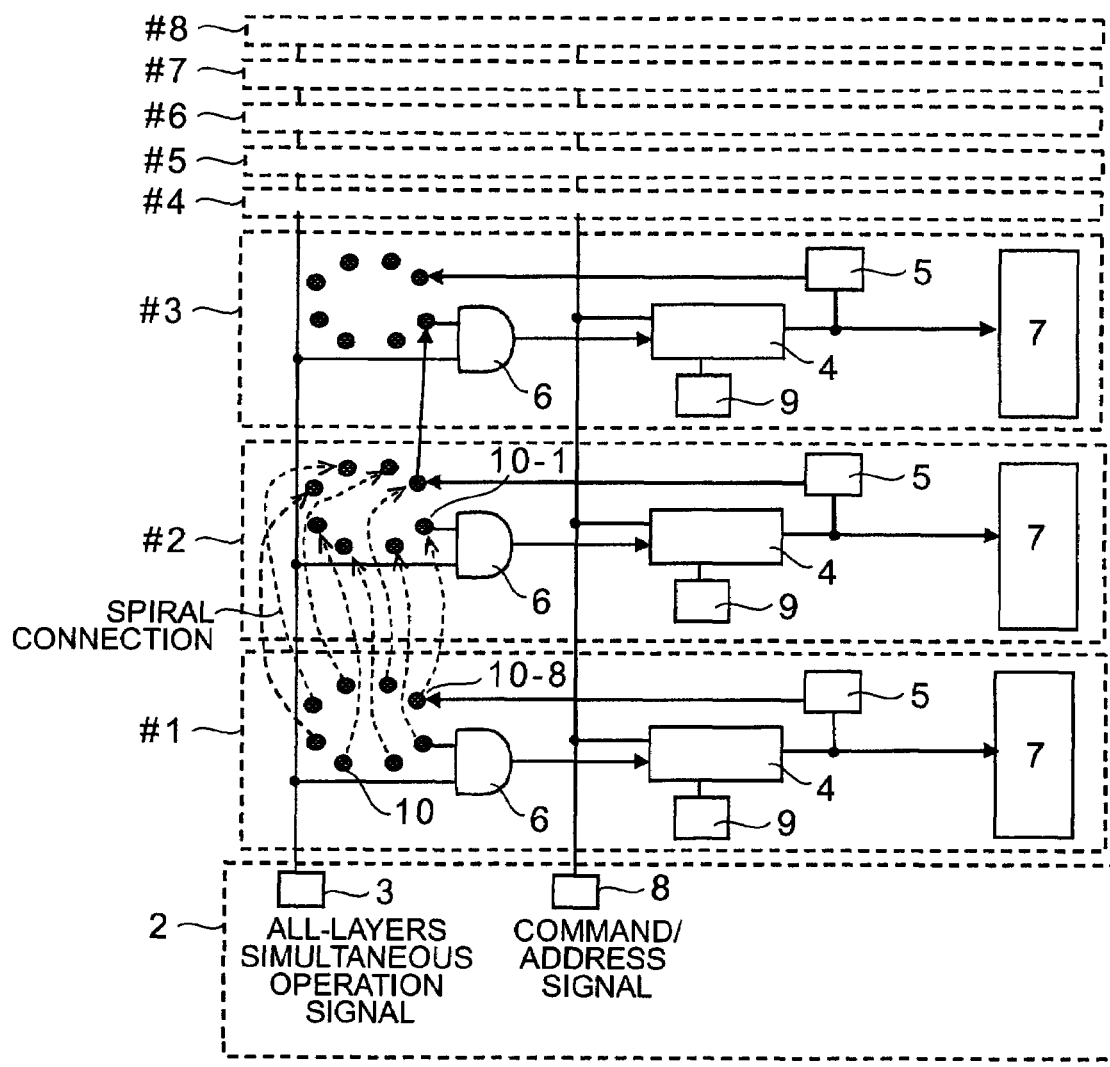
FIG. 4 is a block diagram showing other laminated memory in the present invention.
Figure 5:
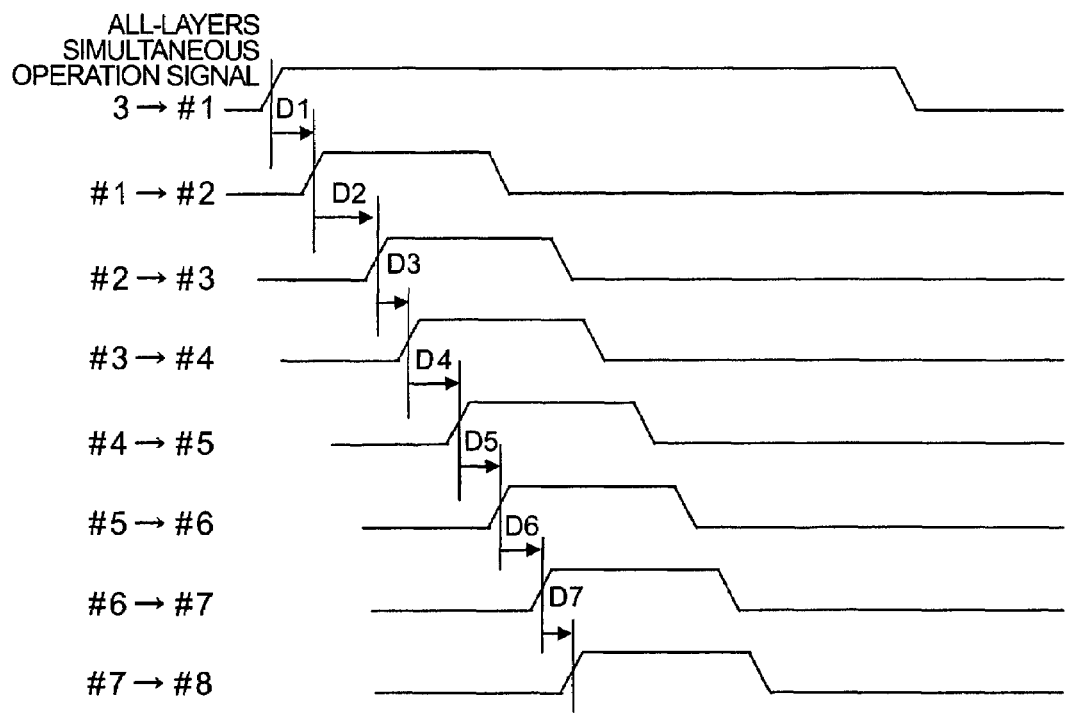
FIG. 5 is a time chart in FIG. 3.
Figure 6:
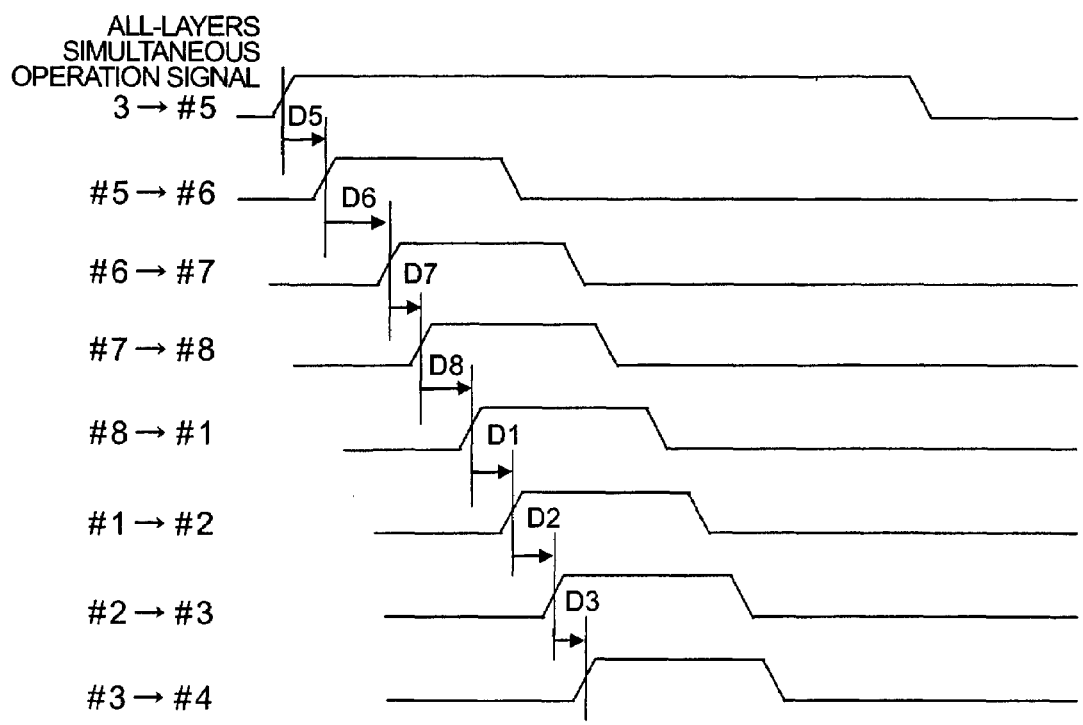
FIG. 6 is a time chart in FIG. 4.

A laminated memory of the present invention will be explained in detail as a best mode of the present invention with reference to FIGS. 2 to 6. FIG. 1A shows a side elevational view of the laminated memory, and FIG. 1B shows a current waveform in a sequential operation. FIG. 3 shows a block diagram when operation is sequentially carried out from a lower layer, and FIG. 4 shows a block diagram when operation is carried out sequentially from a designated memory core layer. FIGS. 5 and 6 show time charts in FIGS. 3 and 4, respectively.

Figure 2A:
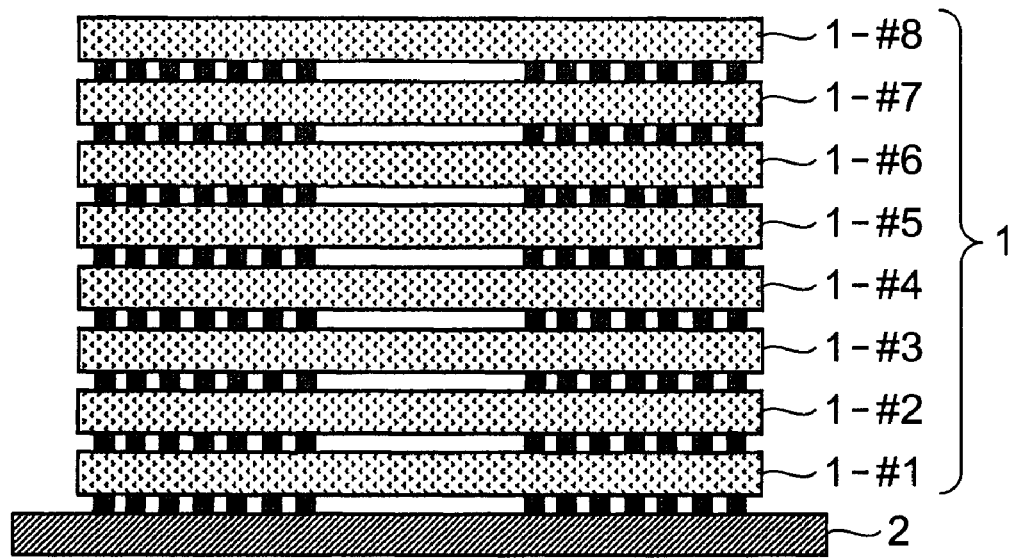
FIG. 2A is a side elevational view of a laminated memory in the present invention.

In the laminated memory shown in FIG. 2A, eight memory core layers 1 (1-#1 to 1-#8) are laminated on a control logic layer 2. It is sufficient for the control logic layer 2 to have a function capable of controlling memory core layers to be laminated. The function may be a function for simply transmitting a signal as an interposer and is not particularly limited. As illustrated in FIG. 3, each of the memory core layers 1 (1-#1 to 1-#8) has a core layer control circuit 4 having the same arrangement, a delay circuit 5, an AND circuit 6 and an internal memory circuit portion 7. The internal memory circuit portion 7 may be a memory having the same arrangement or a memory having a different arrangement. Further, the respective memory core layers 1 (1-#1 to 1-#8) may be connected to each other by a solder ball and the like, and a method of connecting them is not particularly limited.

In the following description, when the memory core layer is generically called, it may be called a memory core layer 1, and an N-th memory core layer may be called a memory core layer #N.

Figure 2B:
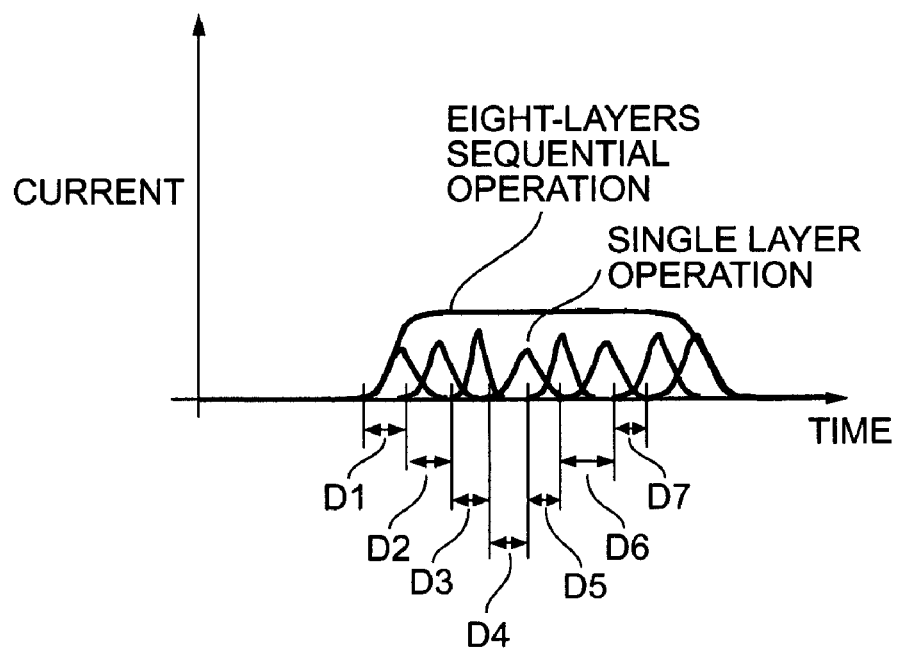
FIG. 2B is a current waveform view of the laminated memory in the present invention when eight layers are sequentially operated.

In a sequential operation of the present invention shown in FIG. 2B, the period of delay times of the respective memory core layers 1 are not set to a constant period of time and are caused to correspond to the operation periods of time of the respective memory core layers 1. For this purpose, memory core layers 1 operating at a high speed have a short period of delay time, while memory core layers 1 operating at a low speed has a long period of delay time. In this manner, a period of delay time corresponding to a period of operation time is allocated to each of the memory core layers 1. The memory core layers 1 are sequentially activated at an optimum timing by causing the period of operation time to correspond to the period of delay time as described above. As a consequence, the operation current of the memory core layers 1 can be dispersed and a peak current can be suppressed.

To achieve the sequential operation of the memory core layers 1, each of the memory core layers 1 includes the delay circuit 5 having a period of delay time corresponding an operation time to an input command, as shown in FIG. 3. Each of the memory core layers 1 is operated in correspondence to an input operation signal as well as sends an output signal from the delay circuit 5 to a next stage. After the period of delay time corresponding to the period of operation time passes, each of the memory core layers 1 sequentially sends an output signal to a next stage and activates the memory core layer 1 of the next stage. The memory core layers 1 are sequentially activated at the optimum timing by causing the period of operation time to correspond to the period of delay time as described above. Consequently, the operation current of the memory core layers 1 can be dispersed so that a peak current can be suppressed. Activating the memory core of a next stage by causing the period of operation time of the memory core layer 1 itself to the period of delay time of the delay circuit 5 is called autonomic and sequential activation.

FIG. 3 shows a block diagram of the laminated memory when sequential operation is carried out from a memory core layer #1 as a lower layer to a memory core layer #8 as an upper layer, and FIG. 5 shows a time chart of the operation.

As illustrated in FIG. 3, each of the memory core layers 1 has a core layer control circuit 4, a delay circuit 5, an AND circuit 6 and an internal memory circuit portion 7. With this structure, an all-layers simultaneous operation signal 3 from the control logic layer 2 is input to the core layer control circuit 4 and an AND circuit 6 of the nearest memory core layer #1 (here, the lower layer). An internal signal from the core layer control circuit 4 is input to the internal memory circuit portion 7 and the delay circuit 5. The internal memory circuit portion 7 starts operation in response to the internal signal, and the delay circuit 5 delays the internal signal.

In this event, the internal memory circuit portion 7 and the delay circuit 5 are arranged in the same memory chip. Therefore, the internal memory circuit portion 7 and the delay circuit 5 have similar conditions with respect to variation in a manufacturing process, a power supply voltage supplied thereto, and a temperature. Accordingly, the period of operation time of the internal memory circuit portion 7 and the period of delay time of the delay circuit 5 exhibit the same characteristics. The delay circuit 5 may be any circuit as long as it corresponds to the period of operation time of the internal memory circuit portion 7, and the delay circuit 5 may be composed of an inverter circuit and a pseudo-replica circuit formed by reducing the size of the internal memory circuit.

The delay circuit 5 sends the internal signal to the AND circuit 6 with a period of delay time (D1) corresponding to the operation of the internal memory circuit portion 7. The AND circuit 6 sends an operation signal to a memory core layer #2 of a next stage in response to the all-layers simultaneous operation signal 3 input thereto and an output signal from the delay circuit 5. The memory core layers #2 of the next stage is activated by the operation signal. The period of delay time (D) is set in correspondence to the period of operation time and the operation current of the internal memory circuit portion 7. For example, the next stage is activated at a timing at which an operation current passes through a peak value.

An operation current $1_{\#1}$ of the initial memory core layer #1 passes through the peak value and begins to drop. Then, the memory core layer #2 of the next stage begins operation and an operation current $1_{\#2}$ begins to flow. The respective current values may be set such that they cross at a point of 50% of the peak current. They may be set such that they cross at a point of 30% of the peak current. Further, the memory core layer 1 of the next stage may be activated after about 70% of the period of operation time of the internal memory circuit portion 7 passes. The period of delay time of the delay circuit 5 can be set according to an object of use of the laminated memory. It is not particularly limited as long as it is possible to prevent overlap of large current values. As mentioned above, activation of a next stage, which is carried out after the period of delay time corresponding to the period of operation time of the internal memory circuit portion 7, is called an autonomic and sequential activating operation.

The memory core layer #2 is composed of the same block as the memory core layer #1 and carries out the same operation. A core layer control circuit 4 of the memory core layer #2 is input with an operation signal from the memory core layer

1. The internal memory circuit portion 7 of the memory core layer #2 starts operation. Then, the AND circuit 6 of the memory core layer #2 sends an operation signal to a next memory core layer #3 after a period of delay time (D2) corresponding to the period of operation time of the memory core layer #2. Further, the memory core layer #3 sends an operation signal to a next memory core layer #4 after a period of delay time (D3) corresponding to the period of operation time of the memory core layer #3. In this manner, the operation signal is sequentially sent to the memory core layers #5, #6, #7, #8 after period of delay times D4, D5, D6, D7 corresponding to the periods of operation time of the memory core layers 1. The simultaneous operation of the laminated memory is completed after the final memory core layer #8 is operated.

FIG. 5 shows a time chart of these memory core layers.

At first, the all-layers simultaneous operation signal 3 output from the control logic layer 2 activates the memory core layer #1. The memory core layer #1 outputs an operation signal delayed by the period of internal delay time D1 to the memory core layer #2 so as to activate it. The memory core layer #2 outputs an operation signal delayed by the period of internal delay time D2 to the memory core layer #3. The memory core layers #1-#8 are sequentially activated by sequentially carrying out the above operations. Herein, the period of delay times D from the respective memory core layers 1 are different period of delay times corresponding to the period of operation times of the respective memory core layers 1. Therefore, the peak currents of the respective memory core layers 1 are not overlapped. Thus, the current can be effectively dispersed.

As mentioned above, the internal memory circuit portion 7 of a memory core layer #N is activated by an internal signal from the core layer control circuit 4 thereof so that operation is carried out by the internal signal. Further, after a period of delay time corresponding to a period of operation time of the internal memory circuit portion 7, the memory core layer #N sends an operation signal to a memory core layer (#N+1) of a next stage. In this manner, activation is sequentially continued. The amounts of delay of the respective memory core layers 1 are prescribed by the internal circuits of the respective memory core layers themselves. Therefore, proper amounts of delay can be set so as to reflect a difference among the manufacturing processes, the operation temperatures, the power supply conditions, and the like of the respective memory core layers 1. As a consequence, a transient current can be effectively dispersed and an operation can be stably carried out.

FIG. 4 shows other embodiment of the present invention.

In the embodiment, each of memory core layers 1 is additionally provided with a command/address signal 8, a memory core layer identification number (ID) 9, and spiral connection terminals 10 for spiral connection. An all-layers simultaneous operation signal 3 output from a control logic layer 2 is supplied to AND circuits 6 of all the memory core layers 1 and a memory core layer 1 designated by the command/address signal 8 is activated first. At the time, whether or not the memory core layer 1 is designated by the command/address signal 8 is self-determined by the memory core layer identification number (ID) 9. The memory core layer identification number (ID) 9 is stored as a series of numbers for identifying the memory core layers 1.

Further, after the period of delay time of the designated memory core layer 1, an output signal for designating the memory core layer 1 of a next stage is input to a spiral connection terminal 10 corresponding to a lamination number. An output signal from a delay circuit 5 of the memory core layer 1 operated first is input to one spiral connection terminal $10_{-8}$. The output signal is connected to a spiral connection terminal $10_{-1}$ of the memory core layer 1 of a next stage. The spiral connection terminal $10_{-1}$ is connected to one input of the AND circuit 6. The AND circuit 6 is input with an output signal from a previous stage and the all-layers simultaneous operation signal 3 so as to activate the memory core layer 1 of itself by an operation signal as an output therefrom.

The spiral connection terminal $10_{-8}$ of the previous stage is connected to the spiral connection terminal $10_{-1}$ of a next stage. Further, the spiral connection terminal 10-1 of the previous stage is connected to the spiral connection terminal $10_{-2}$ of a next stage. In this manner, the spiral connection terminals 10 are spirally connected clockwise. All the memory core layers 1 are sequentially activated by repeating these operations. The periods of delay times of the delay circuits 5 of the respective memory core layers 1 correspond to the periods of operation times of the respective memory core layers 1. Thus, a next stage is activated after a period of delay time corresponding to the period of operation time of the internal memory circuit portion 7 as the autonomically and sequentially activating operation.

The operation in the embodiment of the present invention shown in FIG. 4 will be explained referring to a time chart of FIG. 6.

The all-layers simultaneous operation signal 3 output from the control logic layer 2 is supplied to the AND circuits 6 of all the memory core layers 1. In parallel with the above operation, a memory core layer 1 to be activated first is designated by the command/address signal 8 and activated (in FIG. 6, a memory core layer #5). The memory core layer #5 outputs an output signal delayed by a period of internal delay time D5 to a spiral connection terminal 10 corresponding to a lamination number. A next layer (a memory core layer #6) to be activated next is designated and activated by the spiral connection. The memory core layer #6 activates a memory core layer #7 by a signal delayed by a period of internal delay time D6. Memory core layers #5-#8 and memory core layers #1-#4 are sequentially activated by carrying out the above operation sequentially. In this manner, all the memory core layers 1 can be activated from the memory core layer #5 as a start point.

In the present invention, the memory core layers 1 are sequentially operated with a proper period of delay time in place of that they are simultaneously operated so that the operation current can be made smooth. Each of the memory core layers 1 includes the delay circuit 5 having the period of delay time corresponding to the period of operation time of the internal memory circuit portion 7. A memory core layer 1, to which a simultaneous operation signal 3 is input, is operated in response to the operation signal and a delay circuit 5 sends an operation signal to a next stage after a period of delay time passes. The memory core layer 1 itself has the autonomically and sequentially activating function for activating the memory core layer 1 of a next stage after a period of time corresponding to the period of operation time of the internal memory circuit portion 7 passes. Since the memory core layer 1 of the next stage is autonomically and sequentially activated, a peak current can be dispersed at an optimum timing in the simultaneous operation. As a result, a laminated memory can be obtained which can realize effective transient current dispersion and stable operation.

Although the present invention is specifically explained based on the embodiments, it is needless to say that the present invention is by no means limited to the embodiments and can be variously modified within a scope that does not depart from the gist of the present invention and these modifications are included in the present invention.

What is claimed is:

1. A laminated memory, comprising:
a plurality of memory core layers which are sequentially laminated,
wherein each of the memory core layers includes an internal memory circuit portion and a delay circuit having a period of delay time corresponding to a period of operation time of the internal memory circuit portion, and
a first memory core layer activated by a simultaneous operation signal operates a first internal memory circuit portion, and
a second memory core layer of a next stage is activated by an output signal delayed by a first delay circuit.

2. A laminated memory, comprising:
a plurality of memory core layers which are sequentially laminated,
wherein each of the memory core layers includes an internal memory circuit portion and a delay circuit having a period of delay time corresponding to a period of operation time of the internal memory circuit portion, and
a first memory core layer activated by a simultaneous operation signal operates a first internal memory circuit portion, and
a second memory core layer of a next stage is activated by an output signal delayed by a first delay circuit,
wherein each of the memory core layers further comprises a core control circuit, and
an internal signal from a first core control circuit of the first memory core layer, to which the simultaneous operation signal is input, activates the first internal memory circuit portion of the first memory core layer and is input to the first delay circuit of the first the memory core layer.

3. The laminated memory according to claim 2, wherein:
each of the memory core layers further comprises a logic circuit, and
a first logic circuit of the first memory core layer is input with the simultaneous operation signal and an output signal from the first delay circuit of the first memory core layer and outputs an operation signal for activating the second memory core layer.

4. The laminated memory according to claim 3, wherein:
the second core control circuit of the second memory core layer is input with the operation signal from the first memory core layer and operates a second internal memory circuit portion of the second memory core layer
a second delay circuit of the second memory core layer, which is input with an internal signal as an output of the second core control circuit, outputs an output signal at a time corresponding to an operation time of the second internal memory circuit portion, and
a second logic circuit of the second memory core layer is input with an operation signal from the first memory core layer and an output signal from the second delay circuit of the second memory core layer and outputs an operation signal for activating a third memory core layer of a next stage.

5. The laminated memory according to claim 2, wherein:
the first memory core layer is located adjacent to a control logic layer,
the second memory core layer is located adjacent to the first the memory core layer, and
the remaining memory core layers located adjacent to each other are sequentially activated.

6. The laminated memory according to claim 2, wherein:
the first memory core layer is selectively activated by a command/address signal and a memory core layer identification number, and
an output signal from the first delay circuit of the first the memory core layer activates the second memory core layer.

7. The laminated memory according to claim 6, wherein:
each of the memory core layers further comprises a logic circuit,
a second logic circuit of the second memory core layer is input with the simultaneous operation signal and an output signal from the first memory core layer,
a second core layer control circuit of the second memory core layer is input with an output from a second logic circuit of the second memory core layer,
an internal signal as an output of the second core layer control circuit activates a second internal memory circuit of the second memory core layer and is input to a second delay circuit of the second memory core layer, and
a third memory core layer is activated by an output from the second delay circuit.

8. The laminated memory according to claim 7, wherein:
each of the memory core layers comprises spiral connection terminals, and
the terminals are sequentially connected clockwise so that an output from a delay circuit of the memory core layer of a previous stage is connected to one input terminal of a logic circuit of the memory core layer of a next stage.

9. The laminated memory according to claim 7, wherein:
an identification number is stored to each of the memory core layers as the memory core layer identification number.

10. A memory device having a plurality of memory core layers, each of the memory core layers comprising a first terminal supplied with an input operation signal, a memory circuit activated in response to the input operation signal, a delay circuit producing a delayed signal when a predetermined period of time has elapsed from supply of the operation command signal to the first terminal, and a second terminal outputting an output operation signal thereat in response to the delayed signal, the memory core layers being connected such that the second terminal of a preceding one of the memory core layers is electrically connected to the first terminal of a succeeding one of the memory core layers to supply the output operation signal produced from the preceding one of the memory core layers to the succeeding one of the memory core layers as the input operation signal for the succeeding one of the memory core layers.

11. The memory device as claimed in claim 10, further comprising a device terminal supplied with a simultaneous operation signal, the device terminal being connected to the first terminal of a leading one of the memory core layers to supply the simultaneous operation signal to the leading one of the memory core layers as the input operation signal, each of the memory core layers further including a gate circuit supplied with the input operation signal and the delayed signal to produce the output operation signal.

12. The memory device as claimed in claim 10, wherein each of the memory core layers further comprising a third terminal, the memory device further having a device terminal supplied with a simultaneous operation signal and electrically connected in common to the third terminals of the memory core layers, the memory circuit of each of the memory core layers being activated in response to the input operation signal supplied during the simultaneous operation signal being supplied to the third terminal.

13. The memory device as claimed in claim 11, wherein the memory core layers are stacked with each other with a control layer that produces the simultaneous operation signal.

14. The memory device as claimed in claim 12, wherein the memory core layers are stacked with each other with a control layer that produces the simultaneous operation signal.

* * * * *